(12) United States Patent
Conner et al.

(10) Patent No.: US 7,329,982 B2
(45) Date of Patent: Feb. 12, 2008

(54) LED PACKAGE WITH NON-BONDED OPTICAL ELEMENT

(75) Inventors: Arlie R. Conner, Portland, OR (US); Catherine A. Leatherdale, St. Paul, MN (US); Andrew J. Ouderkirk, Woodbury, MN (US); John A. Wheatley, Lake Elmo, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 8 days.

(21) Appl. No.: 10/977,249

(22) Filed: Oct. 29, 2004

(65) Prior Publication Data

US 2006/0091784 A1    May 4, 2006

(51) Int. Cl.
*H01J 1/62* (2006.01)
*H01L 33/00* (2006.01)

(52) U.S. Cl. .................. 313/498; 313/512; 313/501; 313/110; 313/111; 257/98; 362/555; 362/800

(58) Field of Classification Search ................ 313/498, 313/512; 257/98; 362/555, 800
See application file for complete search history.

(56) References Cited

U.S. PATENT DOCUMENTS

| | | | |
|---|---|---|---|
| 3,596,136 A | 7/1971 | Fischer | |
| 4,225,380 A | 9/1980 | Wickens | |
| 4,675,058 A | 6/1987 | Plaster | |
| 5,055,892 A | 10/1991 | Gardner et al. | |
| 5,255,171 A | 10/1993 | Clark | |
| 5,403,773 A | 4/1995 | Nitta et al. | |
| 5,553,089 A | 9/1996 | Seki et al. | |
| 5,578,839 A | 11/1996 | Nakamura et al. | |
| 5,698,452 A | 12/1997 | Goossen | |
| 5,747,832 A | 5/1998 | Nakamura et al. | |
| 5,779,924 A | 7/1998 | Krames et al. | |
| 5,793,062 A | 8/1998 | Kish, Jr. et al. | |
| 5,925,898 A | 7/1999 | Späth | |
| 6,091,020 A | 7/2000 | Fairbanks et al. | |
| 6,412,971 B1 | 7/2002 | Wojnarowski et al. | |
| 6,429,462 B1 | 8/2002 | Shveykin | |

(Continued)

FOREIGN PATENT DOCUMENTS

EP    1 213 773    6/2002

(Continued)

OTHER PUBLICATIONS

Definition of Frustrated Total Internal Reflection: http://scienceworld.wolfram.com/physics/FrustratedTotalInternalReflection.html.*

(Continued)

*Primary Examiner*—Mariceli Santiago
*Assistant Examiner*—Anne M Hines
(74) *Attorney, Agent, or Firm*—Jay R. Pralle

(57) ABSTRACT

Light sources are disclosed utilizing LED dies having at least one emitting surface. An optical element is provided for efficiently extracting light out of an LED die by controlling the angular distribution of the emitted light. The optical element is optically coupled to but is mechanically decoupled from the emitting surface of the LED die. The optical element has an input surface that is optically coupled to the emitting surface, an output surface that is larger in surface area than the input surface, and at least one intermediate surface.

16 Claims, 6 Drawing Sheets

U.S. PATENT DOCUMENTS

| | | |
|---|---|---|
| 6,480,389 B1 | 11/2002 | Shie et al. |
| 6,483,196 B1 | 11/2002 | Wojnarowski et al. |
| 6,495,862 B1* | 12/2002 | Okazaki et al. ............ 257/103 |
| 6,501,091 B1 | 12/2002 | Bawendi et al. |
| 6,727,313 B2 | 4/2004 | Zhou et al. |
| 6,819,486 B2 | 11/2004 | Ma et al. |
| 2002/0030194 A1 | 3/2002 | Camras et al. |
| 2002/0163719 A1 | 11/2002 | Ma et al. |
| 2002/0165310 A1 | 11/2002 | Zhou et al. |
| 2003/0025449 A1 | 2/2003 | Rossner |
| 2004/0036080 A1 | 2/2004 | Bogner et al. |
| 2004/0041222 A1 | 3/2004 | Loh |
| 2004/0046179 A1 | 3/2004 | Baur et al. |
| 2004/0051106 A1 | 3/2004 | Baur et al. |
| 2004/0150991 A1 | 8/2004 | Ouderkirk et al. |
| 2004/0164311 A1 | 8/2004 | Uemura |
| 2004/0184270 A1 | 9/2004 | Halter |
| 2004/0246744 A1* | 12/2004 | Krupa et al. ............... 362/574 |
| 2005/0023545 A1 | 2/2005 | Camras et al. |
| 2005/0173719 A1 | 8/2005 | Yonekubo et al. |
| 2005/0213310 A1 | 9/2005 | Takeda |
| 2005/0243570 A1 | 11/2005 | Chaves et al. |

FOREIGN PATENT DOCUMENTS

| | | |
|---|---|---|
| EP | 1 396 754 | 3/2004 |
| GB | 1409793 | 10/1975 |
| JP | 61127186 | 6/1986 |
| JP | 3-6506 | 1/1991 |
| JP | 07007184 | 1/1995 |
| JP | 09-167515 | 6/1997 |
| JP | 2001036148 | 2/2001 |
| JP | 2001059922 | 3/2001 |
| WO | WO 01/41219 | 6/2001 |
| WO | WO 01/41225 | 6/2001 |
| WO | WO 02/15281 | 2/2002 |
| WO | WO 03/069685 | 8/2003 |
| WO | WO 2004/040346 | 5/2004 |
| WO | WO 2004/068183 | 8/2004 |
| WO | WO 2004/068602 | 8/2004 |
| WO | WO 2004/068603 | 8/2004 |
| WO | WO 2004/070839 | 8/2004 |

OTHER PUBLICATIONS

Zhu, S., Yu, A.W., Hawley, D., and Roy, R., "Frustrated Total Internal Reflection: A Demonstration And Review," American Journal of Physics, vol. 54 (7), pp. 601-607.*

"The Emergence of LEDs—Luminance to Illumination" http://www.lumileds.com/pdfs/TP40_IESNA_July%202004_LED_Paper.pdf, last visited on Mar. 4, 2005.

Camras et al., "Light Emitting Diodes with Improved Light Extraction Efficiency", File History as of Oct. 29, 2004 (excluding references), U.S. Appl. No. 09/880,204.

N. Goodman, R. Ignatius, L. Wharton, and R. Winston, "Solid-dielectric Compound Parabolic Concentrators: On Their Use with Photovoltaic Devices", Applied Optics, vol. 15, No. 10, pp. 2434-2436, 1976.

Krames et al., "High-power truncated-inverted-pyramid $(Al_xGa_{1-x})_{0.5}In_{0.5}P/GaP$ light-emitting diodes exhibiting >50% external quantum efficiency", Applied Physics Letters, vol. 75, No. 16, pp. 2365-2367, Oct. 18, 1999.

I. Schnitzer et al., "30% external quantum efficiency from surface textured, thin-film light-emitting diodes", Applied Physics Letters, vol. 63, No. 16, 2174-2176, 1993.

E. Schubert, "Light Emitting Diodes", Cambridge University Press, United Kingdom, pp. 114-154, 2003.

Keith Scott, "IESNA 2004: From Concept to Reality to the Future", IESNA Great Lakes Region Education Fly-In, Lumileds Lighting, Jun. 2004, http://www.lumileds.com/pdfs/TP41_IESNA_Buffalo_6-04.pdf; last visited Feb. 7, 2005.

U.S. Application entitled "Reflective Light Coupler", filed Dec. 2, 2003, having U.S. Appl. No. 10/726,244.

U.S. Application entitled "Illumination Assembly", filed Dec. 2, 2003, having U.S. Appl. No. 10/727,220.

U.S. Application entitled "LED Array Systems", filed Jun. 1, 2004, having U.S. Appl. No. 10/858,539.

U.S. Application entitled "Reshaping Light Source Modules and Illumination Systems Using the Same", filed Feb. 11, 2004, having U.S. Appl. No. 10/776,155.

U.S. Application entitled "Polarized LED", filed Oct. 29, 2004, having U.S. Appl. No. 10/977,582.

U.S. Application entitled "High Brightness LED Package with Compound Optical Element(s)", filed Oct. 29, 2004, having U.S. Appl. No. 10/977,225.

U.S. Application entitled "Process for Manufacturing Optical and Semiconductor Elements", filed Oct. 29, 2004, having U.S. Appl. No. 10/977,239.

U.S. Application entitled "Process for Manufacturing a Light Emitting Array", filed Oct. 29, 2004, having U.S. Appl. No. 10/977,240.

U.S. Application entitled "High Brightness LED Package", filed Oct. 29, 2004, having U.S. Appl. No. 10/977,577.

U.S. Application entitled "High Brightness LED Package with Multiple Optical Elements", filed Oct. 29, 2004, having U.S. Appl. No. 10/977,248.

U.S. Application entitled "LED Package with Front Surface Heat Extractor", filed Oct. 29, 2004, having U.S. Appl. No. 10/977,241.

West et al., "LED Backlight for Large Area LCD TV's", http://www.lumileds.com/solutions/LCD/Luxeon_Direct-SID_2003.pdf, last visited on Feb. 4, 2005.

West et al., "Hight Brightness Direct LED Backlight for LCD-TV", SID 03 Digest, ISSN/0003-0966X/03/3403-0694, 2003, http://www.lumileds.com/pdfs/techpaperspres/HiBrtDirLEDTV.PDF, Last visited on Feb. 4, 2005.

"Total Internal Reflection", Eric Weisstein's World of Physics, http://scienceworld.wolfram.com/physics/TotalInternalReflection.html, Mar. 21, 2007.

* cited by examiner

LED PACKAGE WITH NON-BONDED OPTICAL ELEMENT

RELATED PATENT APPLICATIONS

The following co-owned and pending U.S. patent application Ser. No. 10/977,241 is incorporated by reference: "LED PACKAGE WITH FRONT SURFACE HEAT EXTRACTOR", filed 29 Oct. 2004.

FIELD OF INVENTION

The present invention relates to light sources. More particularly, the present invention relates to light sources in which light emitted from a light emitting diode (LED) is extracted using an optical element.

BACKGROUND

LEDs have the inherent potential to provide the brightness, output, and operational lifetime that would compete with conventional light sources. Unfortunately, LEDs produce light in semiconductor materials, which have a high refractive index, thus making it difficult to efficiently extract light from the LED without substantially reducing brightness, or increasing the apparent emitting area of the LED. Because of a large refractive index mismatch between the semiconductor and air, an angle of an escape cone for the semiconductor-air interface is relatively small. Much of the light generated in the semiconductor is totally internally reflected and cannot escape the semiconductor thus reducing brightness.

Previous approaches of extracting light from LED dies have used epoxy or silicone encapsulants, in various shapes, e.g. a domed structure over the LED die or formed within a reflector cup shaped around the LED die. Encapsulants typically have a higher index of refraction than air, which reduces the total internal reflection at the semiconductor-encapsulant interface thus enhancing extraction efficiency. Even with encapsulants, however, there still exists a refractive index mismatch between a semiconductor die (typical index of refraction, n of 2.5 or higher) and an epoxy encapsulant (typical n of 1.5).

FIG. 1 shows another approach for providing an LED with improved light extraction efficiency (U.S. Patent Application Publication No. U.S. 2002/0030194A1) (Camras et al.). This approach uses a transparent optical element 2 having a refractive index greater than about 1.8, bonded to an LED die 4. A disadvantage of this approach is that when the optical element 2 is bonded to the LED die 4, the bonded system incurs stress forces from each element expanding as it heats up during operation.

LEDs need to be operated at a relatively low junction temperature, typically no more than 125 to 150° C. This limits the maximum current flow and, correspondingly, the output of the LED. Poor heat management can also adversely impact LED lifetime by causing the LED die to run hotter than desired at a given current. Enhancing heat extraction from the LED die can increase the driving current thus providing higher light intensity and longer lifetime. Known methods of extracting or dissipating heat from the LED die include extracting heat through the base of the LED die (typically the side opposite the primary emitting surface). Other methods include adding a heat dissipating fluidic coolant to the LED package, for example as described in U.S. Pat. No. 6,480,389 (Shie et al.).

SUMMARY

Although advancements have been made, LEDs still have potential to be even brighter. It would be advantageous to have an LED package which allows light to be efficiently extracted from the LED die, and to maintain both high brightness and high luminous output. The present application discloses light sources that utilize LED dies having at least one emitting surface and an optical element that is mechanically decoupled from the emitting surface of the LED die. The optical element has an input surface that is optically coupled to the emitting surface, an output surface that is larger in surface area than the input surface, and at least one intermediate surface.

The above summary of the present invention is not intended to describe each disclosed embodiment or every implementation of the present invention. The Figures and the detailed description below more particularly exemplify illustrative embodiments.

BRIEF DESCRIPTION OF THE DRAWINGS

The invention may be more completely understood in consideration of the following detailed description of various embodiments of the invention in connection with the accompanying drawings, where like reference numerals designate like elements. The appended drawings are intended to be illustrative examples and are not intended to be limiting. Sizes of various elements in the drawings are approximate and may not be to scale.

FIG. 6a is a top view of the optical element shown in FIG. 5a.

DETAILED DESCRIPTION

As described in more detail below, the present system provides a light source with an optical element for efficiently extracting light out of an LED die by modifying the angular distribution of light emitted by the LED die. The optical element is optically coupled to the emitting surface an LED die to efficiently extract light.

In some embodiments, the optical element is also thermally coupled to the LED die to permit heat removal from the LED die. To further extract heat away from the optical element, a thermally coupled heat sink clamp is added.

In other embodiments, an LED die is optically coupled to the optical element without use of any adhesives or other bonding agents between the LED die and the optical element. This allows the optical element and the LED die to move independently as they each expand when heated during operation. Absence of a bond or mechanical decoupling eliminates stress forces on the optical element and the LED die that may be present in a system bonded with adhesive or other bonding agents.

Figure 1:
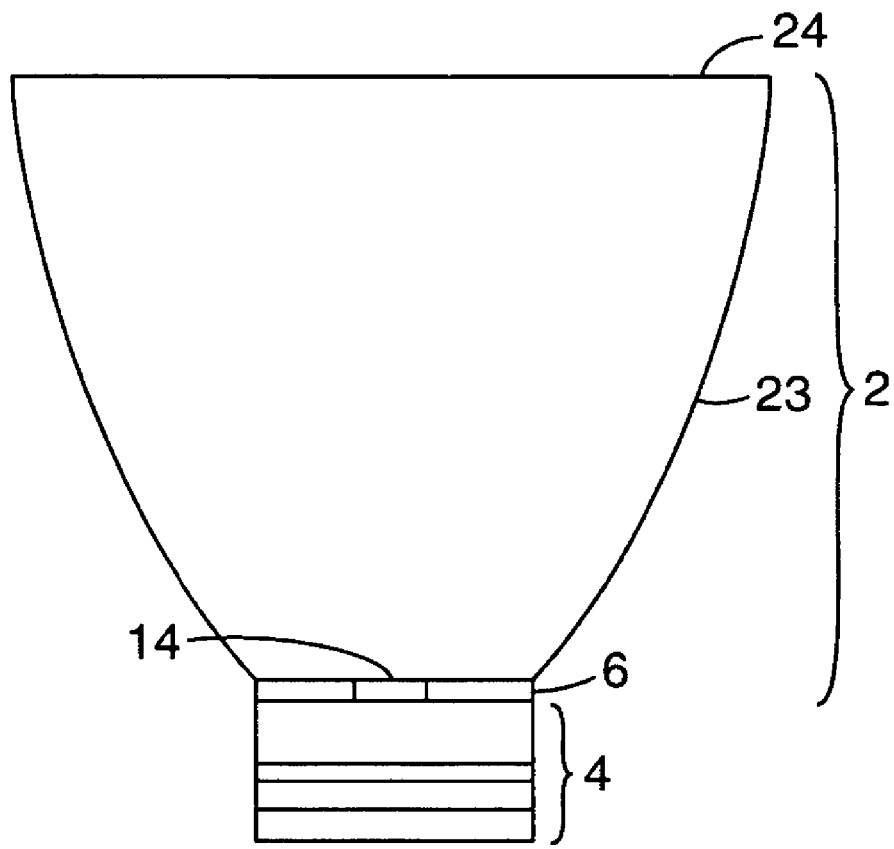
FIG. 1 is a schematic diagram of an optical collimator bonded to a light emitting diode of a Prior Art system.
Figure 2:
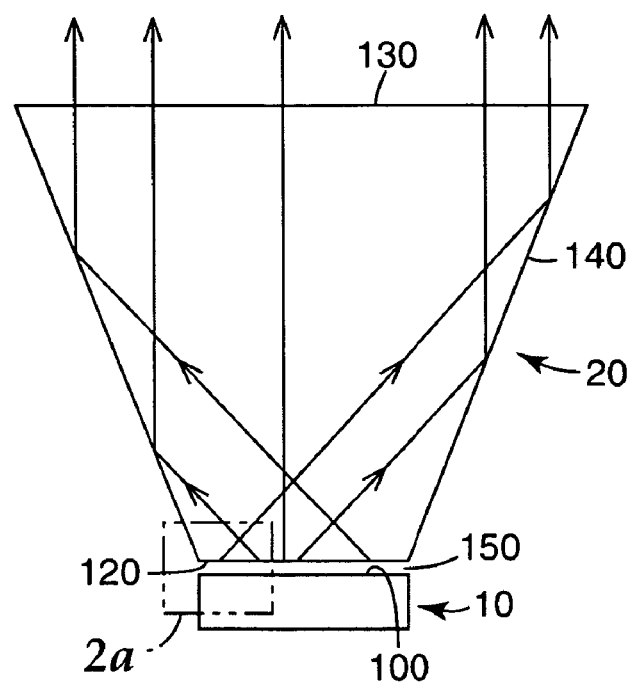
FIG. 2 is a schematic side view illustrating an optical element and LED die configuration in one embodiment.

FIG. 2 is a schematic side view illustrating a configuration of an optical element 20 and an LED die 10 in one embodiment of the present system. The optical element 20 is transparent and preferably has a relatively high refractive index. Suitable materials for the optical element include without limitation high index glasses (e.g. Schott glass type LASF35, available from Schott North America, Inc., Elmsford, N.Y. under a trade name LASF35) and ceramics (e.g. sapphire, zinc oxide, zirconia, diamond, and silicon carbide). Sapphire, zinc oxide, diamond, and silicon carbide are particularly useful since these materials also have a relatively high thermal conductivity (0.2-5.0 W/cm K).

Figure 3A:
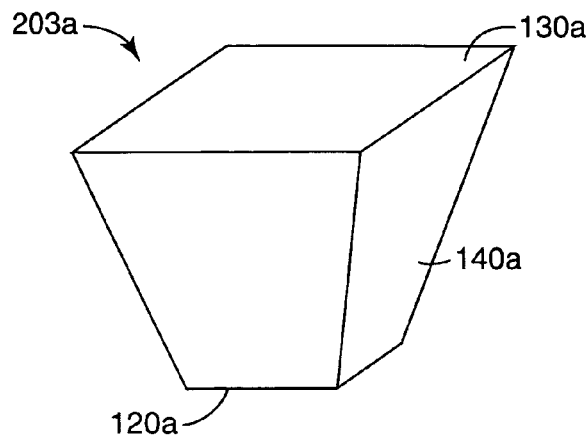
FIGS. 3a-3c are schematic views of exemplary shapes of the optical element.
Figure 3B:
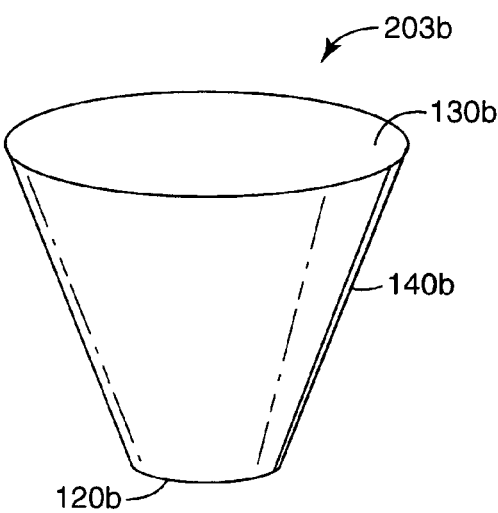
Figure 3C:
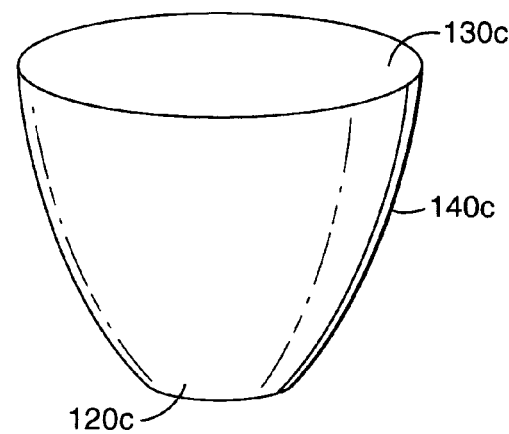

In one embodiment, the optical element 20 is shaped in the form of a taper as shown in FIG. 2. A tapered optical element 20 can have numerous forms, including without limitation those shown in FIGS. 3a, 3b, and 3c. The optical element can be in the form of other shapes, such as those depicted in FIGS. 4a-e, as well as other shapes not shown. The tapered optical element 20 shown in FIG. 2 is a particularly advantageous shape of the optical element. In FIG. 2, the tapered optical element 20 has an output surface 130 that is larger than an input surface 120. Tapered shapes, including a truncated inverted pyramid (TIP) shown in FIG. 3a, a truncated cone shown in FIG. 3b, and a shape with parabolic sidewalls as shown in FIG. 3c, and combinations thereof, provide the additional benefit of collimating light and are referred to herein as optical collimators. Using an optical collimator to extract light out of an LED die is particularly advantageous because it provides control over the angular distribution of light emitted. Additional shapes for optical collimators will be apparent to those skilled in the art. For example, a TIP shape, shown in FIG. 3a can be modified to have curved sidewalls similar to those shown in FIG. 3c. Other variations are contemplated. In addition, as will be described below, optical collimators can also be shaped such that the direction of emitted light is changed by the optical element 20. When made of high index materials such as those mentioned above, such optical elements increase light extraction from the LED die due to their high refractive index and collimate light due to their shape, thus modifying the angular emission of light. It will be understood by those skilled in the art that when collimation is less important or is not desired other shapes of optical element 20 may be used.

The LED die 10 is depicted generically for simplicity, but can include conventional design features as known in the art. For example, LED die 10 can include distinct p- and n-doped semiconductor layers, buffer layers, substrate layers, and superstrate layers. A simple rectangular LED die arrangement is shown, but other known configurations are also contemplated, e.g., angled side surfaces forming a truncated inverted pyramid LED die shape. Electrical contacts to the LED die 10 are also not shown for simplicity, but can be provided on any of the surfaces of the die as is known. In exemplary embodiments the LED die has two contacts both disposed at the bottom surface as shown in FIG. 5c. This LED die design is known as a "flip chip". The present disclosure is not intended to limit the shape of the optical element or the shape of the LED die, but merely provides illustrative examples.

Figure 4A:
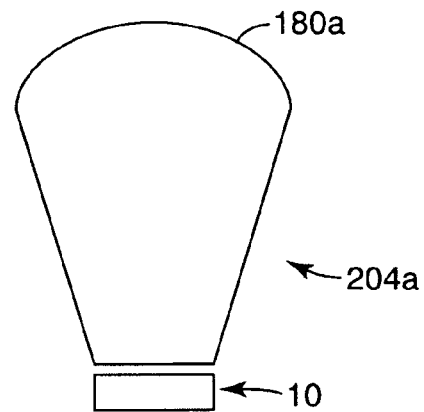
FIGS. 4a-4e are schematic side views of additional exemplary shapes of the optical element.
Figure 4B:
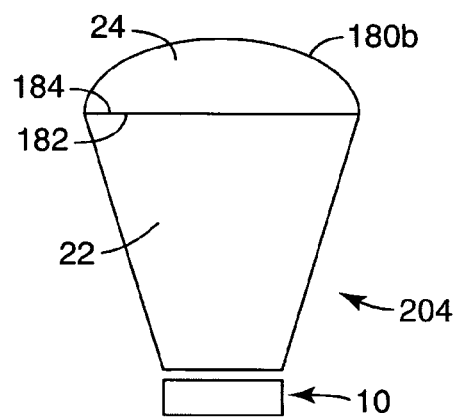
Figure 4C:
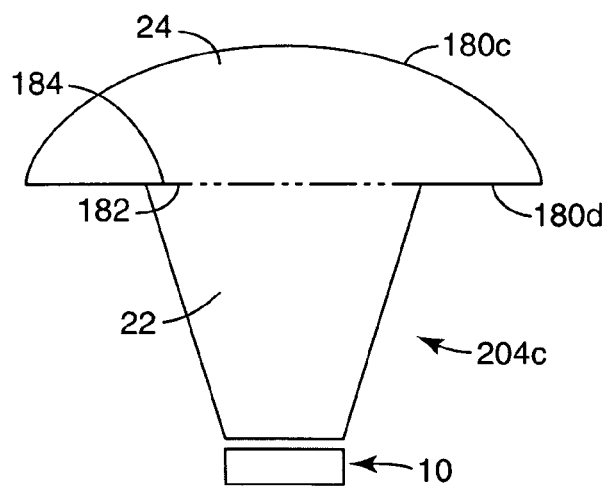

The optical element 20 shown in FIG. 2 has an input surface 120, an output surface 130, and at least one intermediate side surface 140 disposed between the input surface 120 and the output surface 130. If the optical element is shaped in the form of a TIP, as shown in FIG. 3a, then such an optical element 203a contains four intermediate side surfaces 140a. If the optical element is rotationally symmetric, then it will have a single side surface, For example if optical element 20 is shaped as an inverted cone as shown in FIG. 3b or shaped with parabolic sidewalls as shown in FIG. 3c, then such an optical element 203b or 203c, respectively, has a single side surface 140b or 140c, respectively. Other shape variations can be used. Each optical element depicted in FIGS. 3a-c contains an input surface 120a-c and an output surface 130a-c, respectively. The shapes and cross sections of the input surface and the output surface can vary. Exemplary shapes are shown as input surfaces 120a-c and output surfaces 130a-c. FIG. 3a shows a square cross section, while FIGS. 3b-c show circular cross sections of the output surface. Other cross sectional shapes are also contemplated, e.g. an optical element having a square input surface and a rectangular output surface. In the examples shown in FIGS. 3a-c, the output surface is shown to be flat and parallel to the input surface. Other arrangements are also contemplated, for example an output surface that is angled with respect to the input surface. FIGS. 4a-c show additional embodiments, in which the shape of the output surface is curved to control the angle of emitted light.

In one embodiment, depicted in FIG. 4a, an optical element 204a is shown having a curved output surface 180a. The optical element 204a is made from a single structure, for example cut from a single block of material.

In another embodiment, shown in FIG. 4b, an optical element 204b having a curved output surface 180b is shown. The optical element 204b is made by joining a tapered element 22 having a flat output surface 182 to a lens element 24 having a flat input surface 184 and a curved output surface 180b. The tapered element 22 and the lens element 24 can be made of either the same material or of two or more different materials with similar optical properties, and in some embodiments similar thermal properties, depending on design considerations. The input surface 184 is adhered to or otherwise joined to the output surface 182 using conventional means. FIG. 4b shows a lens element 24 of the same cross sectional size as the output surface 182 of the tapered element 22.

FIG. 4c shows another example of an optical element 204c, including a lens element 24 that is larger in cross section than tapered element 22. For example, the diameter of the lens element 24 could be twice the diameter of the output surface 182 of the tapered element 22. In FIG. 4c, a phantom line shows the portion where the tapered element 22 is joined with the lens element 24. The portion of the input surface 184 that is outside the cross sectional area of the output surface 182 is shown in FIG. 4c as surface 180d. The shapes depicted in FIGS. 3a-c and 4a-c are exemplary and it is understood that other variations of these shapes can also be used. Preferably, the tapered element 22 has equal or higher index of refraction than the lens element 24. Additional description of compound optical elements can be found in co-filed and co-owned U.S. patent application Ser. No. 10/977,255 titled "HIGH BRIGHTNESS LED PACKAGE WITH COMPOUND OPTICAL ELEMENT(S)", which is incorporated herein by reference in its entirety.

Figure 4D:
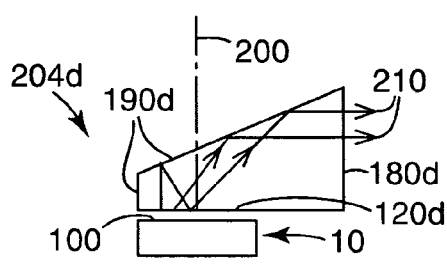
Figure 4E:
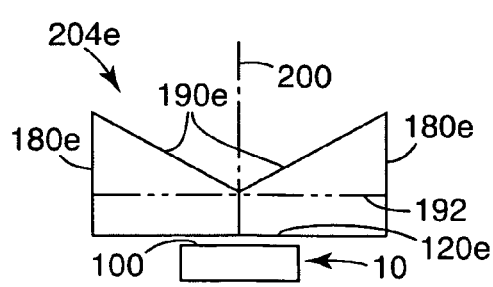

FIGS. 4d-e depict additional embodiments of the present system. In FIG. 4d, an optical element 204d is a wedge shape with an output surface 180d positioned perpendicular to an input surface 120*d*. Two intermediate surfaces 190*d* are shown, a first intermediate surface that is parallel to the output surface 180*d* and a second intermediate surface that defines a plane angled to join opposing edges of the first intermediate surface 190*d* and output surface 180*d*. In this embodiment, light emitted by the LED die 10 at the primary emitting surface 100 is redirected by about 90 degrees by optical element 204*d* at the second intermediate surface 190*d*, as shown by light rays 210. The top view of a wedge shaped output element could be rectangular, trapezoidal, pie shaped, semicircular, or any combination thereof.

In another embodiment, shown in FIG. 4*e*, an optical element 204*e* is a "batwing" structure, having opposing output surfaces 180*e* and an intermediate surface 190*e* formed into a "V" shape. A batwing structure can have various cross sectional shapes including, without limitation, square, rectangular, or circular cross-sections. One example of such a batwing structure can be thought of as a wedge shape of FIG. 4*d* that has been rotated around a normal line 200 to form the batwing shape shown in FIG. 4*e*. If the cross section is circular the output surfaces 180*e* form a cylindrical shape. Light emitted by the emitting surface 100 in a random pattern centered around a normal line 200 is redirected 90 degrees from normal 200 into a ring formed around the cylinder defined by output surface 180*e*. Such a batwing structure takes a Lambertian light distribution at its input surface and modifies it to a torroidal light distribution centered around the normal. It is noted that in shapes such as the batwing shape discussed above, the surface referred to as the intermediate surface 190*e* can be physically disposed at the top portion of the optical element, rather than on a lateral portion as in some of the previous embodiments. As described in previous embodiments, the output element can be made of a single material or from several materials, for example as shown joined at phantom line 192, shown in FIG. 4*e*. These embodiments are particularly suited for use as backlights in liquid crystal display (LCD) panels, where brightness uniformity can be important. Whether made of a single material or of two materials joined at phantom line 192, the distance between input surface 120*e* and the surface defined by line 192 as well as the angle of faceted surfaces 190*e* can be optimized for a specific application.

In some embodiments the optical element and the LED die are positioned close together to allow optical coupling without use of additional optical materials. FIG. 2 shows a gap 150 between the emitting surface 100 of the LED die 10 and the input surface 120 of optical element 20. Typically, the gap 150 is an air gap and is typically very small to promote frustrated total internal reflection. Preferably, the thickness of the gap 150 is less than a wavelength of light in air. In LEDs where multiple wavelengths of light are used, the gap 150 is preferably at most the value of the longest wavelength. One example of a suitable thickness for gap 150 is less than 200 Angstroms. Another example of a suitable thickness for gap 150 is less than 50 Angstroms. In addition, it is preferred that the gap 150 be substantially uniform over the area of contact between the emitting surface 100 and the input surface 120, and that the emitting surface 100 and the input surface 120 have a roughness of less than 20 nm, preferably less than 5 nm. In such configurations, a light ray emitted from LED die 10 outside the escape cone or at an angle that would normally be totally internally reflected at the LED die-air interface will instead be transmitted into the optical element 20. To promote optical coupling, the surface of input surface 120 can be shaped to match the emitting surface 100. For example, if the emitting surface 100 of LED die 10 is flat, as shown in FIG. 2, the input surface 120 of optical element 20 can also be flat. The size of input surface 120 may either be smaller, equal, or larger than LED die emitting surface 100. Input surface 120 can be the same or different in cross sectional shape than LED die 10. For example, the LED die can have a square emitting surface while the optical element has a circular input surface. Other variations will be apparent to those skilled in the art.

In some embodiments of the present system, the optical element is optically coupled to LED die without bonding. This allows both the LED die and the optical element to be mechanically decoupled and thus allows each of them to move independently. For example, the optical element can move laterally with respect to LED die 10. In another example both optical element and LED die are free to expand as each component becomes heated during operation. In such mechanically decoupled systems the majority of stress forces, either sheer or normal, generated by expansion are not transmitted from one component to another component. In other words, movement of one component does not mechanically affect other components. This configuration is particularly desirable where the light emitting material is fragile, where there is a coefficient of expansion mismatch between the LED die and the optical element, and where the LED is being repeatedly turned on and off.

One example of an LED package with a mechanically decoupled optical element is a system in which optical element 20 is in optical contact with LED die 10 via gap 150 as shown in FIG. 2. In such an example, gap 150 may be an air gap, small enough to promote frustrated total internal reflection, as described above.

Figure 2A:
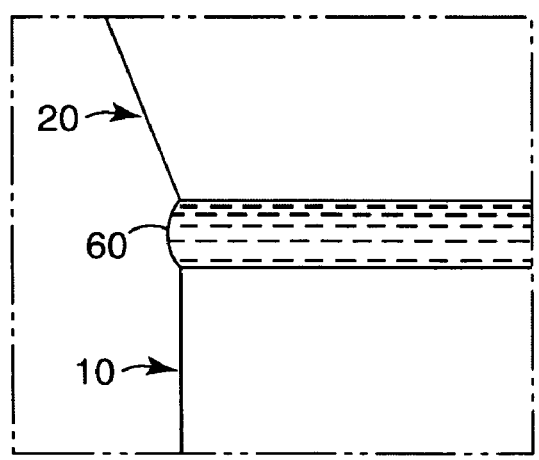
FIG. 2a is a close-up view of a portion of the schematic side view shown in FIG. 2.

Another example of an LED package with a mechanically decoupled or non-bonded optical element is a system in which optical element 20 is optically coupled to LED die 10 via a thin optically conducting layer 60, as shown in FIG. 2*a*. FIG. 2*a* is a close-up view of a portion of the schematic side view shown in FIG. 2 but with a thin optically conducting layer 60 disposed within gap 150. Examples of materials suitable for the optically conducting layer 60 include index matching oils, and other liquids or gels with similar optical properties. Optionally, optically conducting layer 60 is also thermally conducting. A thin layer of an index matching oil, or other similar liquid or gel, can be used to enhance light extraction into the optical element 20. Preferably the liquid or gel has a refractive index greater than that of the LED die 10 but less than the refractive index of the optical element 20. The thickness of such a thin optically conducting layer can be greater than the size of an air gap. In this embodiment LED die 10 need not be optically close to optical element 20 because optically conducting layer 60 acts to optically couple the LED die 10 to the optical element 20. The size of optically conducting layer 60 is determined by the refractive index of the material used. Preferably, the thin optically conducting layer 60 is of a size and made from a material optimized to promote frustrated total internal reflection at the LED die—optically conducting layer interface thus extracting more light from the LED die into the optical element. Preferably, the thickness of optically conducting layer 60 is on the order of a wavelength of light in that material.

Index matching oils or similar liquids or gels have an added benefit of higher thermal conductivity, which helps extract heat, as well as light, out of LED die 10 and into optical element 20. In some embodiments, thin optically conducting layer 60 is also thermally conducting.

Figure 5A:
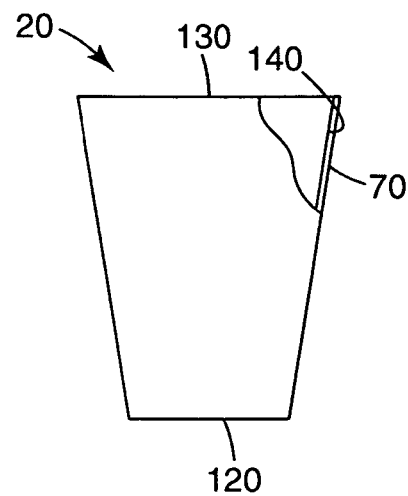
FIG. 5a is a schematic cross section view of an optical element used in some embodiments.
Figure 6A:
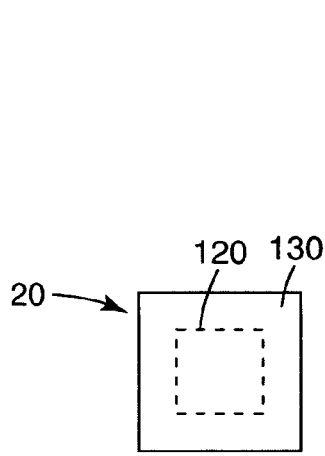
Figure 6B:
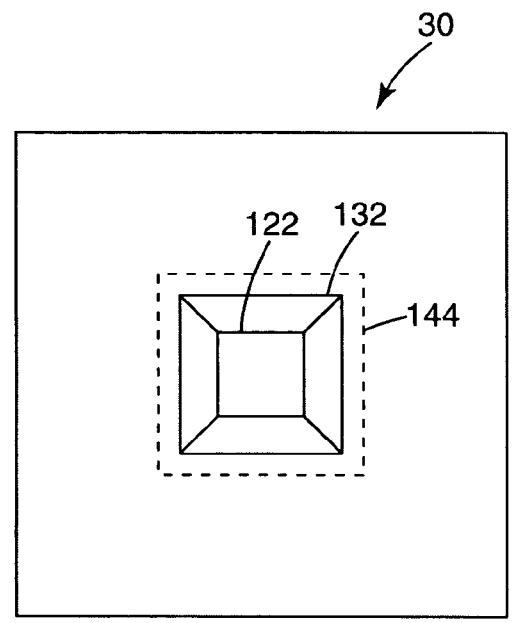
FIG. 6b is a top view of the clamp fixture shown in FIG. 5b.
Figure 7:
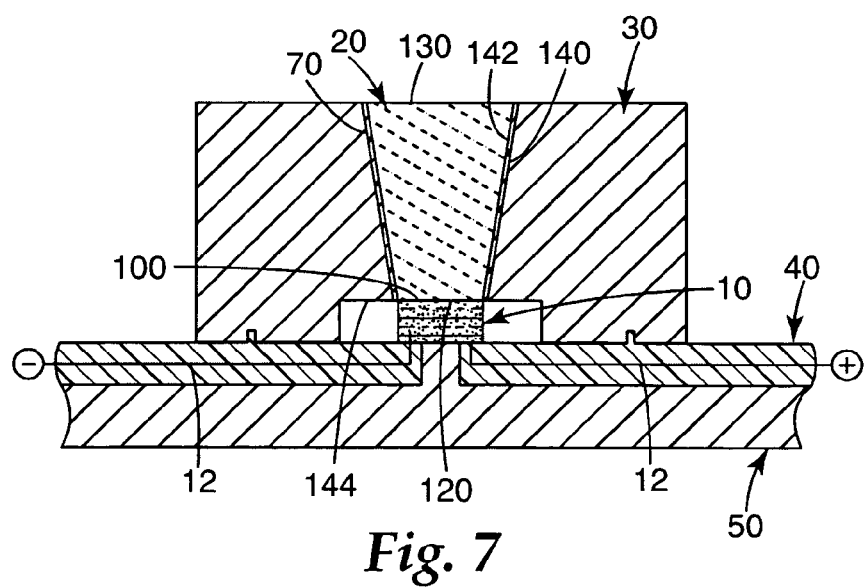
FIG. 7 is a cross sectional view of an assembled LED package in accordance with some embodiments.

FIGS. 5-7 depict another embodiment of the present system. In the exemplary embodiment depicted in FIGS. 5-7, an optical element has a TIP shape, shown in more detail in FIG. 3a. FIG. 5a depicts a schematic cross section side view of an optical element 20. A low index coating 70 is added to each side surface 140 to promote total internal reflection. The low index coating 70 has a refractive index substantially lower than both the refractive index of LED die 10 and the refractive index of optical element 20. Preferably the refractive index of low index coating is less than about 1.5, more preferably less than 1.4. Optionally, the optical element 20 can be coated with a reflective material such as a metal layer or an interference reflector, or combinations thereof using conventional methods.

Figure 5B:
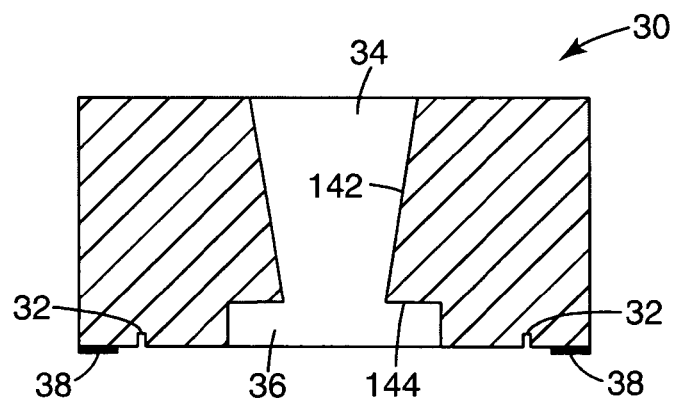
FIG. 5b is a cross sectional side view of a clamp fixture used in some embodiments.
Figure 5C:
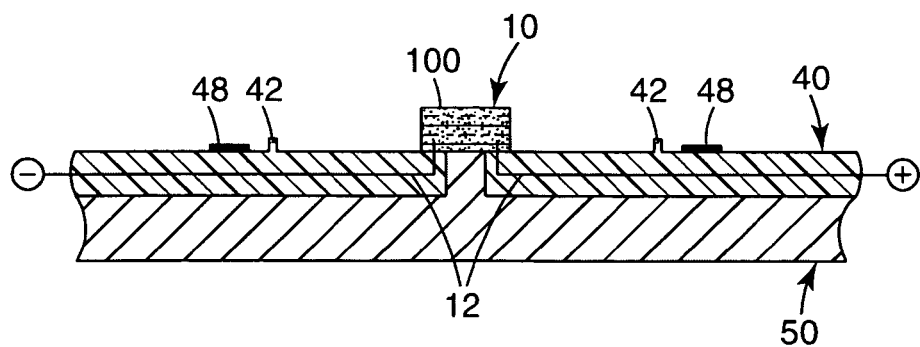
FIG. 5c is a cross sectional side view of an LED die mounted on a circuit board used in some embodiments.

FIG. 5b depicts a schematic side view of a clamp fixture 30 that may be added to the system shown in FIG. 2. When assembled as shown in FIG. 7, the clamp fixture 30 serves to hold optical element 20 in place while positioned directly over and aligned with LED die 10. Clamp fixture 30 can be made of plastic, metal, or other suitable material. In reference to FIG. 5a, clamp 30 has a hollow opening 34 shaped to receive the optical element 20. Hollow opening 34 is defined by side surface 142, which is formed to conform to the shape of side surface 140 of optical element 20. Clamp 30 has an additional cut away portion 36, defined by surface 144 and shaped to receive LED die 10 and optionally allow extra space on any or all sides of the LED die 10. FIG. 5b also shows fiducials 32 which serve to line up clamp fixture 30 with fiducials 42 on circuit board 40, shown in FIG. 5c, so that optical element 20 is positioned directly above LED die 10. FIG. 5c depicts a cross sectional side view of an exemplary configuration of circuit board 40 and LED die 10. In this example, LED die 10 is a flip chip, with contact leads 12 disposed opposite the top emitting surface 100. It is to be understood that side surfaces of LED die 10 may also emit light. The optional additional space of cut away portion 36 can be filled with air to promote TIR at the side surfaces of LED die 10, so that light can be recycled and have another chance to escape from LED die 10 into optical element 20.

The elements shown in FIGS. 5a, 5b and 5c are assembled together as described below to form a system shown in FIG. 7. Optical element 20 is coated with low index coating 70 as shown in FIG. 5a. In some embodiments clamp fixture 30 is metal and is prepared by machining a solid metal block to the shape shown in FIG. 5b. Optical element 20 is inserted into clamp 30 at hollow opening 34. The sides 142 forming opening 34 are soldered to sides 140 of optical element 20, preferably using low melting point solder. Clamp 30 and optical element 20 are then positioned over circuit board 40 shown in FIG. 5c, matching fiducials 32 and 42, so that optical element 20 can be centered directly over LED die 10. The pieces are then soldered together at solder contact points 38 and 48. The assembled system combining elements of FIGS. 5a, 5b and 5c is shown in FIG. 7. Top views of clamp 30 and optical element 20 are depicted in FIGS. 6a and 6b, respectively.

In another embodiment, clamp fixture 30 also serves as a heat sink. In this embodiment, clamp fixture 30 can be made from a high thermal conductivity and thermal diffusivity material (e.g. copper) and does not need to be optically transparent. Clamp 30 in this embodiment further removes heat from the optical element 20 allowing the LED to be operated at higher driving currents thus producing higher brightness. Typical thermal diffusivity values for materials used for optical element 20 are: flint glass—0.004 cm$^2$/s; Sapphire—0.11 cm$^2$/s; Silicon carbide—more than 1.6 cm$^2$/s. Typical thermal diffusivity for copper is 1.2 cm$^2$/s.

Optionally, another heat sink 50 can be added, as shown in FIG. 7. Heat sink 50 extracts heat from LED die 10 via the base of the LED die (typically the side opposite the primary emitting surface).

In embodiments using the clamp fixture 30 as a heat sink, optical element 20 need not be optically close to LED die 10 and can be bonded or non-bonded. For example, optical element 20 can be bonded to LED die 10 using inorganic thin films, fusable glass frit or other bonding agent. Preferably a bonding agent with high thermal conductivity and a similar index of refraction is used to maximize heat transfer and optical transmission. Alternatively, optical element 20 can be held in place over LED die 10 using clamp 30 while optical and thermal coupling between optical element 20 and LED die 10 is achieved using a thermally conducting layer, e.g. an index matching fluid, gel or adhesive with appreciable thermal conductivity, as described above. Typical thermal conductivity for a suitable index matching oil is about 0.01 W/cm K.

In embodiments where the clamp fixture 30 does not serve as a heat sink, the optical element 20 is held over the LED die 10 using the clamp 30 while optical coupling is achieved either via gap 150 or via optically conducting layer 60.

Optical elements disclosed herein can be manufactured by conventional means or by using precision abrasive techniques disclosed in co-filed and co-owned U.S. patent application Ser. No. 10/977,239 titled "PROCESS FOR MANUFACTURING OPTICAL AND SEMICONDUCTOR ELEMENTS", and U.S. patent application Ser. No. 10/977,240 titled "PROCESS FOR MANUFACTURING A LIGHT EMITTING ARRAY", both of which are incorporated herein by reference.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover modifications, equivalents, and alternatives falling within the spirit and scope of the invention as defined by the appended claims.

What is claimed is:

1. A light source, comprising:
   an LED die having a primary emitting surface;
   a transparent optical element including an input surface optically coupled to the primary emitting surface without bonding, an output surface larger than the input surface, and at least one side surface disposed between the input surface and the output surface;
   wherein the input surface is optically coupled to the primary emitting surface of the LED die via a gap such that the light generated by the LED die undergoes frustrated total internal reflection.

2. The light source of claim 1, wherein the optical element is an optical collimator.

3. The light source of claim 1, wherein the optical element is shaped as a taper.

4. The light source of claim 1, wherein a refractive index of the optical element is within 25% of a refractive index of the LED die at the emitting surface.

5. The light source of claim 1, wherein a refractive index of the optical element is at least 1.8.

6. The light source of claim 1, wherein a refractive index of the optical element is at least 2.0.

7. The light source of claim 1, wherein the at least one side surface is highly reflective.

8. The light source of claim 7, wherein the optical element comprises a reflective metallic coating over the at least one side surface.

9. The light source of claim 7, wherein the optical element comprises a low index coating over the at least one side surface.

10. The light source of claim 1, further comprising a thin optically conducting layer disposed between the input surface and the emitting surface.

11. The light source of claim 10, wherein the thin optically conducting layer comprises a liquid.

12. The light source of claim 11, wherein the thin optically conducting layer is also thermally conducting.

13. The light source of claim 12, further comprising a heat sink thermally coupled to the at least one side surface of the transparent optical element.

14. A light source, comprising:
an LED die having an emitting surface; and
an optical element comprising:
   an input surface optically coupled to the emitting surface via an air gap sized to promote frustrated total internal reflection of light generated by the LED die;
   an output surface larger than the input surface; and
   at least one intermediate surface.

15. The light source of claim 14, wherein the air gap is less than a wavelength of light in air.

16. The light source of claim 14, wherein the air gap is less than 200 Angstroms.

* * * * *